United States Patent
Endo

(10) Patent No.: US 8,143,968 B2
(45) Date of Patent: Mar. 27, 2012

(54) THIN FILM BALUN

(75) Inventor: Makoto Endo, Tokyo (JP)

(73) Assignee: TDK Corporation, Tokyo (JP)

( * ) Notice: Subject to any disclaimer, the term of this patent is extended or adjusted under 35 U.S.C. 154(b) by 232 days.

(21) Appl. No.: 12/461,250

(22) Filed: Aug. 5, 2009

(65) Prior Publication Data

US 2010/0045401 A1 Feb. 25, 2010

(30) Foreign Application Priority Data

Aug. 20, 2008 (JP) ................................ 2008-211787

(51) Int. Cl.
*H03H 7/42* (2006.01)
*H01P 3/08* (2006.01)

(52) U.S. Cl. ......................................... 333/26; 333/246

(58) Field of Classification Search .................... 333/25, 333/26, 246

See application file for complete search history.

(56) References Cited

U.S. PATENT DOCUMENTS

| | | | | |
|---|---|---|---|---|
| 6,819,200 B2 * | 11/2004 | Zhao et al. | | 333/26 |
| 7,250,828 B2 * | 7/2007 | Erb | | 333/26 |
| 7,479,850 B2 * | 1/2009 | Kearns et al. | | 333/189 |
| 7,528,676 B2 * | 5/2009 | Kearns et al. | | 333/26 |
| 7,629,860 B2 * | 12/2009 | Liu et al. | | 333/25 |
| 7,948,331 B2 * | 5/2011 | Endo | | 333/25 |
| 8,085,111 B2 * | 12/2011 | Endo | | 333/26 |

FOREIGN PATENT DOCUMENTS

JP B2-3780414 5/2006

* cited by examiner

*Primary Examiner* — Dean O Takaoka
(74) *Attorney, Agent, or Firm* — Oliff & Berridge, PLC

(57) ABSTRACT

A thin film balun includes: an unbalanced transmission line which includes two coils; a balanced transmission line which includes two coils and is electromagnetically coupled to the unbalanced transmission line; a first electrode which is connected to the balanced transmission line and constitutes a capacitor; and a second electrode which is connected to a ground terminal and disposed to be opposed to the first electrode and constitutes the capacitor. The second electrode has a section opposed to the coils configuring the unbalanced transmission line or the balanced transmission line, the section being integrally formed with a section opposed to the first electrode.

11 Claims, 8 Drawing Sheets

THIN FILM BALUN

BACKGROUND OF THE INVENTION

1. Field of the Invention

The present invention relates to a balun that performs unbalanced-to-balanced signal conversion, and more particularly to a thin film balun formed by a thin film process which is advantageous for miniaturization and thickness reduction.

2. Description of the Related Art

Radio communication apparatuses include various high frequency elements such as antenna, filter, RF switch, power amplifier, RF-IC and balun. Here, resonant elements such as antenna and filter handle unbalanced signals relative to the ground potential; however, RF-IC, which produces or processes high frequency signals, handles balanced signals. Thus, in connecting the two types of elements, a balun is used which functions as an unbalanced-to-balanced signal converter.

Sometimes a balanced signal needs to be amplified by applying a bias to a balun used in mobile communication equipment such as mobile-phone and wireless LAN. In this case, between the balanced transmission line of the balun and the ground terminal, a capacitor must be connected in series which has a capacitance which allows the intended frequency signal to flow to GND, so that the DC component and the intended frequency component are separated.

As a balun having such function, Japanese Patent No. 3780414 discloses a laminated balun which has a capacitor disposed between a balanced transmission line and GND terminal of the balun. This laminated balun is formed by using LTCC (Low Temperature Co-fired Ceramics) technique, and the capacitor is formed over the whole area.

To meet the recent demands for miniaturization and thickness reduction of electronic devices, the present inventor has made a diligent study on characteristics of a balun including the related art bias supply capacitor. As a result, it was found that, in a thin film balun formed by a thin film process, the related art bias supply capacitor affects balanced transmission characteristics of the balun. It is expected that this is caused by a structural factor that thin film baluns have a short interlaminar distance between the capacitor and balanced transmission line, compared to laminated baluns. However, it became clear that, as long as the structure of the related art laminated balun is used, various characteristics required by thin film baluns cannot be further improved to a satisfactory level.

To address the above problem, the present invention has been devised, and its object is to provide a thin film balun which, while incorporating a capacitor used to supply a DC bias, allows improvement in balanced transmission characteristics.

SUMMARY OF THE INVENTION

To achieve the above object, a thin film balun according to the present invention includes: an unbalanced transmission line which includes a pair of first coils; a balanced transmission line which includes a pair of second coils and is electromagnetically coupled to the unbalanced transmission line; a first electrode which is connected to the balanced transmission line and constitutes a capacitor; and a second electrode which is connected to a ground terminal and disposed to be opposed to the first electrode and constitutes the capacitor, wherein the second electrode has a section opposed to at least one of the first coils and the second coils, the section being integrally formed with a section opposed to the first electrode.

With this structure, it is expected that the second electrode functions as a capacitor electrode in a region disposed to be opposed to the first electrode and also functions as a shield electrode in a region opposed to at least one of the first coils and the second coils. Some points are still unclear concerning details of operation mechanism by which balanced transmission characteristics (a phase balance and an amplitude balance) of a thin film balun are improved. However, a result is obtained which indicates that, in the second electrode having the structure described above, the balanced transmission characteristics are improved compared with the separately provided capacitor electrode and shield electrode.

Preferably, the second electrode extends from the region opposed to the first electrode to a region opposed to coil openings of the first coils and the second coils. More preferably, the second electrode is disposed in a region opposed to both the first coils and the second coils. It is expected that, if an arrangement area of the second electrode is increased in this way, a shield effect is improved by the increase in the arrangement area.

Preferably, the first electrode is disposed not to overlap the coil openings of the first coils and the second coils. More preferably, the first electrode is disposed in a region opposed to coil conductors of the first coils or the second coils or disposed not to overlap the first coils and the second coils. It is expected that, unlike the arrangement of the second electrode fixed to the ground potential, the influence of the first electrode, which is electrically connected to the balanced transmission line, on the electromagnetic coupling of the unbalanced transmission line and the balanced transmission line is reduced by disposing the first electrode not to overlap the coil openings, whereby the balanced transmission characteristics are improved.

For example, the pair of first coils are disposed side by side on the same surface, the pair of second coils are disposed to be opposed to the pair of first coils, and the first electrode is disposed to be symmetrical with respect to an imaginary line which divides the pair of first coils or the pair of second coils into individual coils. It is expected that the arrangement of a capacitor symmetrical with respect to an imaginary line which divides left and right coils is suitable for balanced transmission characteristics which are required to have symmetry.

According to the present invention, the second electrode connected to the ground terminal has the section opposed to at least one of the first coils and the second coils, the section being integrally formed with a section opposed to the first electrode. Therefore, it is possible to improve the balanced transmission characteristics of the thin film balun.

DETAILED DESCRIPTION OF THE PREFERRED EMBODIMENTS

Figure 1:
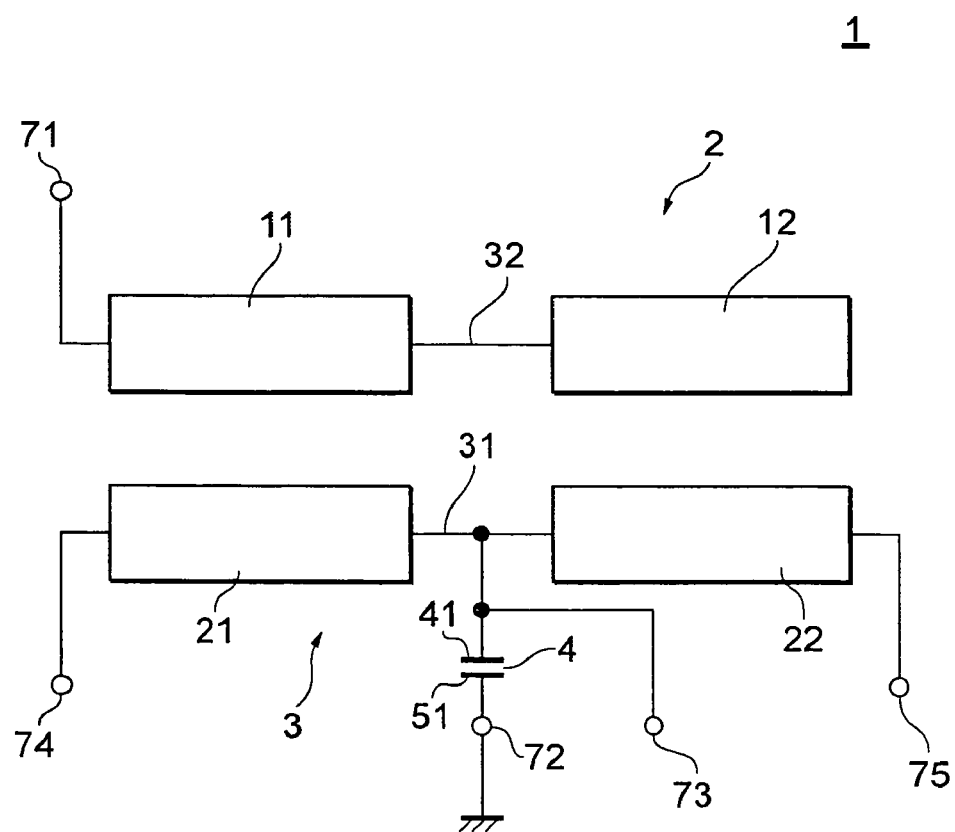
FIG. 1 is an equivalent circuit diagram of a thin film balun 1 according to an embodiment of the present invention.

Embodiments of the present invention will be described below with reference to the drawings. In the drawings, the same reference characters are applied to identical elements, and repeated explanation thereof is omitted. The positional relationship in the up/down/left/right directions is, except if otherwise mentioned, based on the positional relationship illustrated in the drawings. The dimension ratio in the drawings is not limited thereto. The following embodiments are merely exemplary of the present invention, and are not be construed to limit the scope of the present invention. Further, many modifications to the embodiments are possible without departing from the gist of the invention.

FIG. 1 is an equivalent circuit diagram of a thin film balun 1 according to an embodiment of the present invention.

As illustrated in FIG. 1, an unbalanced transmission line 2 includes a coil 11, a coil 12, and a leading wire 32 which connects the coil 11 and the coil 12. One end of the unbalanced transmission line 2 is connected to an unbalanced signal terminal 71. The other end of the unbalanced transmission line 2 is opened. A balanced transmission line 3 includes a coil 21, a coil 22, and a leading wire 31 which connects the coil 21 and the coil 22. One ends of the two coils 21 and 22 are connected to a DC supply terminal 73 via the leading wire 31 and connected to a ground terminal 72 via a capacitor 4. The other ends of the two coils 21 and 22 are connected to balanced signal terminals 74 and 75, respectively.

As described above, the thin film balun 1 includes the unbalanced transmission line 2 including the adjacent pair of coils (first coils) 11 and 12, the balanced transmission line 3 including the pair of coils (second coils) 21 and 22, which are disposed to be opposed to the respective coils 11 and 12 of the unbalanced transmission line 2, and electromagnetically coupled to the unbalanced transmission line 2, the capacitor 4, one end of which is connected to the balanced transmission line 3, and the ground terminal 72 connected to the other end of the capacitor 4. Further, the thin film balun 1 includes, as other terminals, the unbalanced signal terminal 71, the DC supply terminal 73, the balanced signal terminals 74 and 75, and an NC (Non-Connection) terminal 76.

Basic operation of the thin film balun 1 will be described with reference to FIG. 1.

In the thin film balun 1, when an unbalanced signal is input to the unbalanced signal terminal 71, the unbalanced signal propagates through the coil 11, the leading wire 32, and the coil 12. The coil 11 is electromagnetically coupled to the coil 21 and the coil 12 is electromagnetically coupled to the coil 22, whereby the unbalanced signal is converted into two balanced signals having phases 180° different from each other. The two balanced signals are output from the balanced signal terminals 74 and 75. At this point, bias voltage is applied to the DC supply terminal 73, whereby the balanced signals are amplified and output. Operation for converting the balanced signals into the unbalanced signal is the opposite of the operation described above.

As it is evident from the operation of the balun described above, balanced transmission characteristics of the balun are important elements. The balanced transmission characteristics are evaluated higher as the shift of the phases of the two balanced signals is closer to 180° and the intensities of the two balanced signals are closer to each other.

Figure 2:
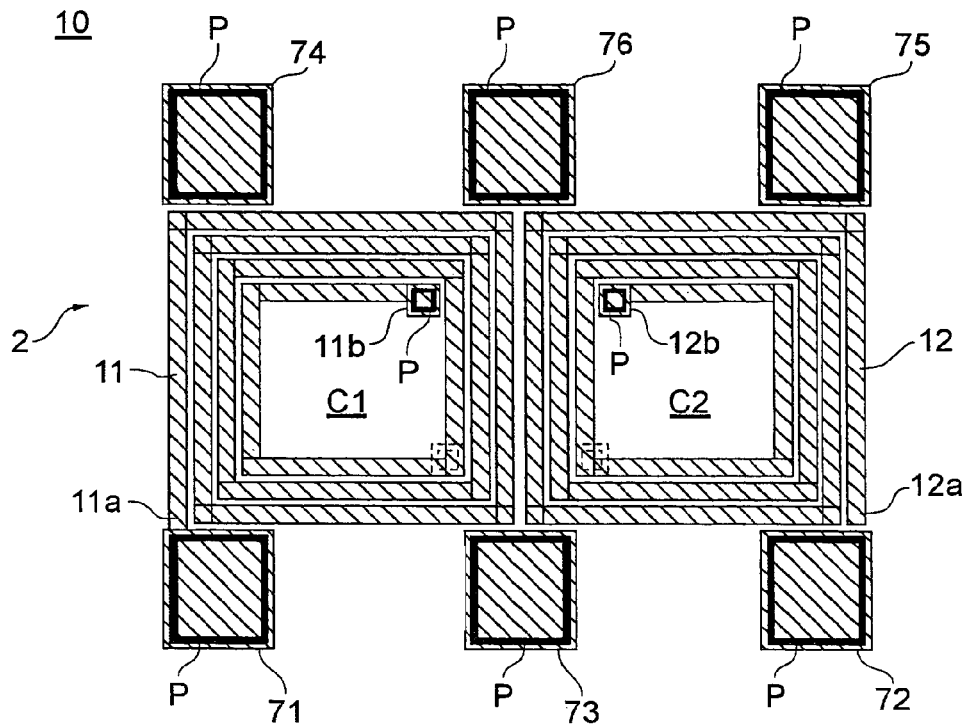
FIG. 2 is a plan view illustrating a first wiring layer 10 of the thin film balun 1.
Figure 3:
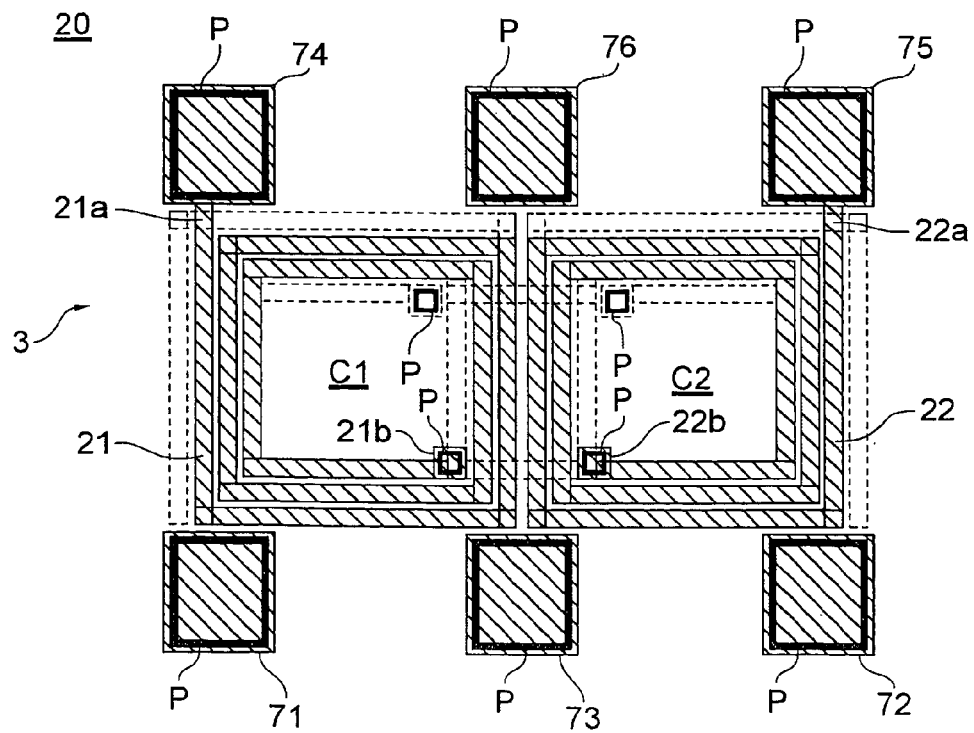
FIG. 3 is a plan view illustrating a second wiring layer 20 of the thin film balun 1.
Figure 4:
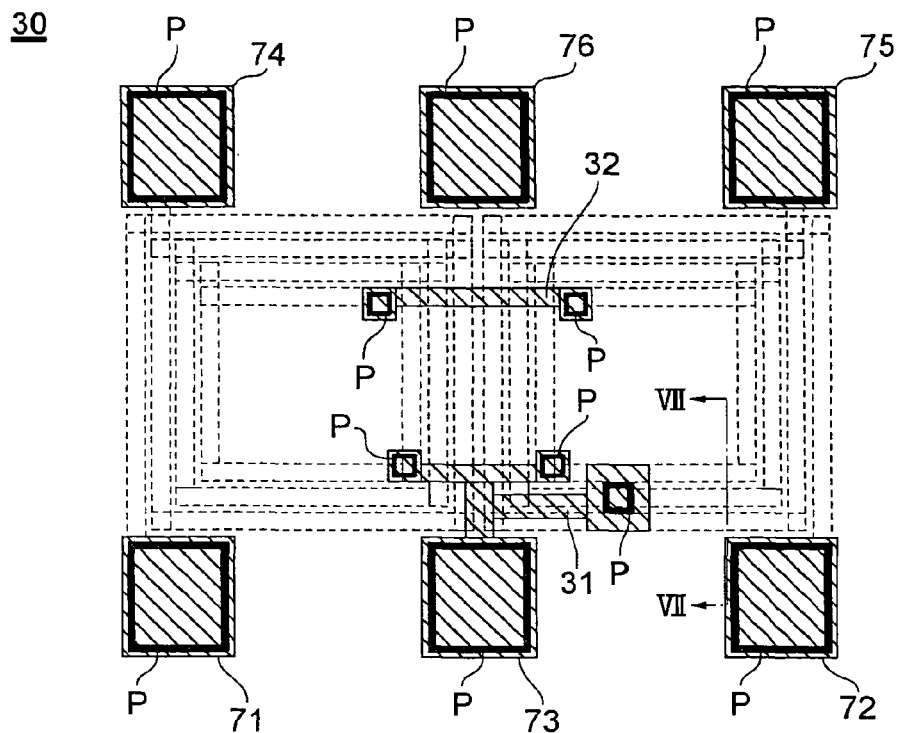
FIG. 4 is a plan view illustrating a third wiring layer 30 of the thin film balun 1.
Figure 5:
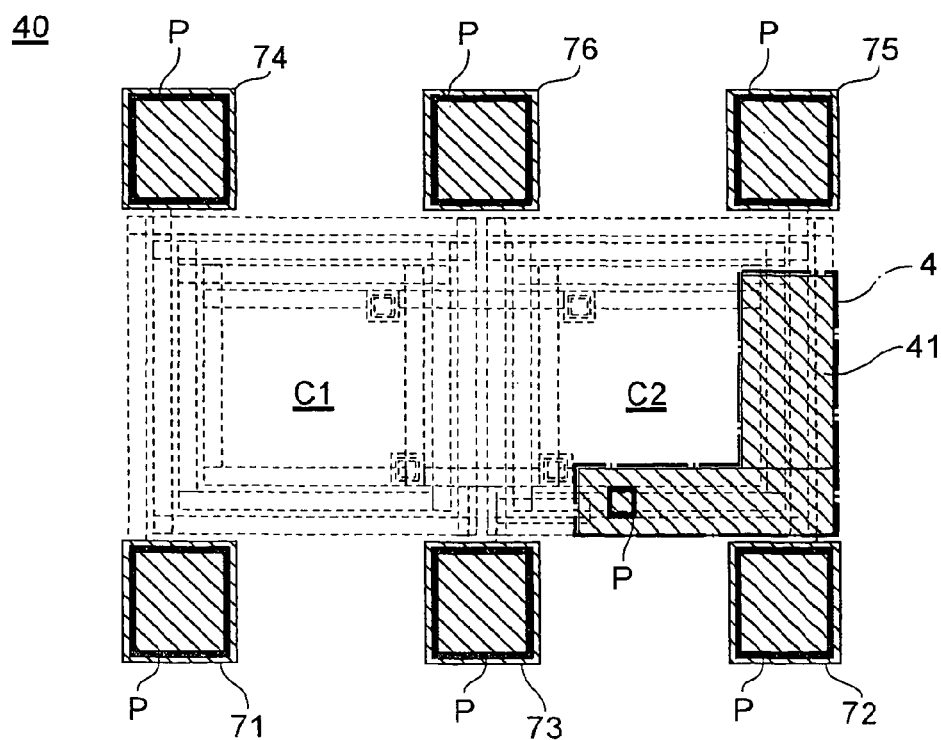
FIG. 5 is a plan view illustrating a fourth wiring layer 40 of the thin film balun 1.
Figure 6:
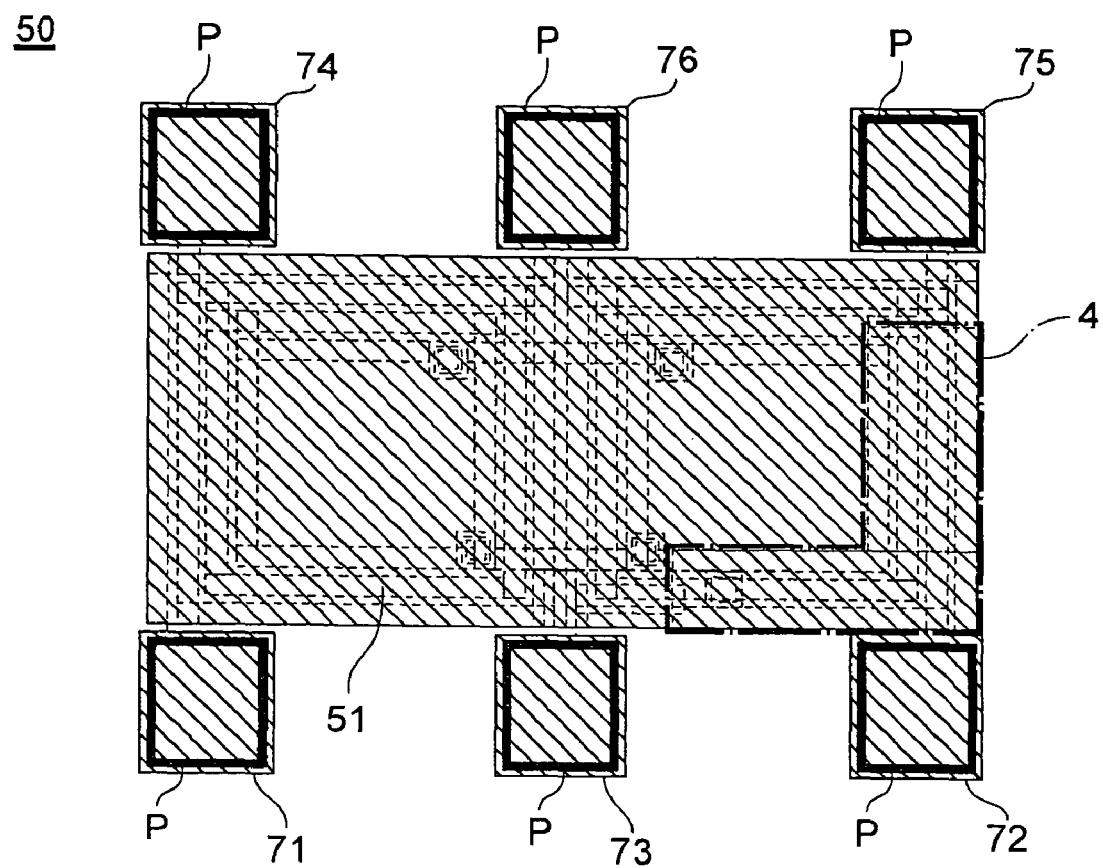
FIG. 6 is a plan view illustrating a fifth wiring layer 50 of the thin film balun 1.
Figure 7:
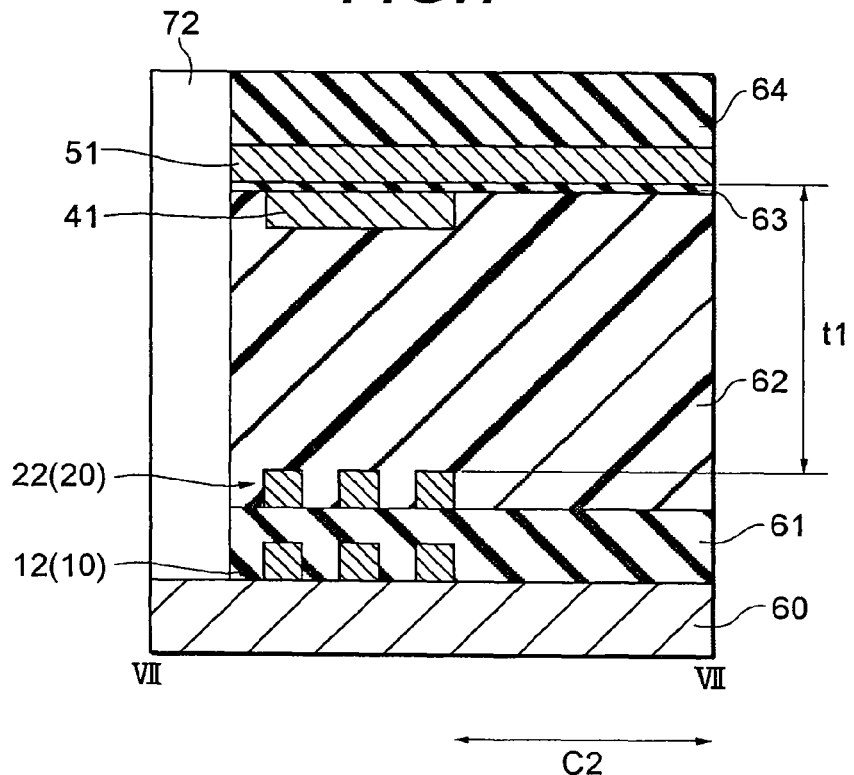
FIG. 7 is a schematic sectional view along VII-VII line in FIG. 4.

The structure of the thin film balun 1 according to this embodiment will be described. FIGS. 2 to 6 are plan views of respective wiring layers of the thin film balun 1. FIG. 2 is a plan view of a first wiring layer 10, FIG. 3 is a plan view of a second wiring layer 20, FIG. 4 is a plan view of a third wiring layer 30, FIG. 5 is a plan view of a fourth wiring layer 40, and FIG. 6 is a plan view of a fifth wiring layer 50. The first wiring layer 10 is a bottom wiring layer and the fifth wiring layer 50 is a top wiring layer. FIG. 7 is a schematic sectional view of the thin film balun 1 along VII-VII line in FIG. 4.

As illustrated in FIGS. 2 to 6, the unbalanced signal terminal 71, ground terminal 72, DC supply terminal 73, balanced signal terminals 74 and 75, and NC (Non-Connection) terminal 76 are formed in all of the first to fifth wiring layers 10 to 50. The terminals 71 to 76 are electrically connected via through holes P between the different layers. Metal plating is formed in all the through holes P illustrated in FIGS. 2 to 6 so that electrical conduction between the layers is made. The structure of the wiring layers will be described in detail below.

In the first wiring layer 10, as illustrated in FIG. 2, two coils 11 and 12 (a pair of first coil sections) constituting the unbalanced transmission line 2 are formed adjacent to each other. The coils 11 and 12 are equivalent to a ¼ wavelength resonator. An end 11a in the outer side of the coil 11 is connected to the unbalanced signal terminal 71, and an end 11b in the inner side of the coil 11 is connected to a through hole P. An end 12b in the inner side of the coil 12 is connected to a through hole P, and an end 12a in the outer side of the coil 12 is open.

In the second wiring layer 20, as illustrated in FIG. 3, two coils 21 and 22 (a pair of second coil sections) constituting the balanced transmission line 3 are formed adjacent to each other. The coils 21 and 22 are equivalent to a ¼ wavelength resonator. The coils 21 and 22 of the balanced transmission line 3 are disposed to face the coils 11 and 12 of the unbalanced transmission line 2, and the facing parts magnetically couple with each other, thus constituting a coupler. An end 21a in the outer side of the coil 21 is connected to the balanced signal terminal 74, and an end 21b in the inner side of the coil 21 is connected to a through hole P. An end 22a in the outer side of the coil 22 is connected to the balanced signal terminal 75, and an end 22b in the inner side of the coil 22 is connected to a through hole P.

In the third wiring layer 30, as illustrated in FIG. 4, leading wires 31 and 32 are formed. The leading wire 31 has a shape branching to connect the three through holes P and the DC supply terminal 73. The leading wire 31 is connected to the end 21b of the coil 21 and the end 22b of the coil 22 via the two through holes P. The leading wire 32 is connected to the end 11b of the coil 11 and the end 12b of the coil 12 via the through hole P.

In the fourth wiring layer 40, as illustrated in FIG. 5, a lower electrode 41 is formed. The lower electrode 41 is connected to the through hole P and the leading wire 31. Consequently, the lower electrode 41 is connected to the DC supply terminal 73 and the coils 21 and 22 of the balanced transmission line 3. The lower electrode 41 is an embodiment of the first electrode of the present invention.

Preferably, the lower electrode 41 is disposed not to overlap a coil opening C1 of the coils 11 and 21 and a coil opening C2 of the coils 12 and 22. More preferably, the lower electrode 41 is disposed in a region opposed to coil conductors of the coils 11, 12, 21, and 22 or disposed in a region on the outside of the coils 11, 12, 21, and 22 not to overlap the coils 11, 12, 21, and 22. It is expected that, unlike the arrangement of the other upper electrode fixed to the ground potential, the influence of the lower electrode 41, which is electrically connected to the balanced transmission line 3, on the electromagnetic coupling of the unbalanced transmission line 2 and the balanced transmission line 3 is reduced by disposing the lower electrode 41 not to overlap the coil openings C1 and C2, whereby the balanced transmission characteristics are improved. In an example illustrated in FIG. 5, the lower electrode 41 is disposed in a region opposed to the coil conductors of the coils 12 and 22.

In the fifth wiring layer 50, as illustrated in FIG. 6, an upper electrode 51 disposed to be opposed to the lower electrode 41 is formed. The capacitor 4 includes the lower electrode 41, the upper electrode 51, and a dielectric film between layers of the lower electrode 41 and the upper electrode 51. The upper electrode 51 is connected to the ground terminal 72. The upper electrode 51 is an embodiment of the second electrode of the present invention.

The upper electrode 51 extends from a region opposed to the lower electrode 41 to a region opposed to at least one of the coil openings C1 and C2 and is also used as a shield electrode. Preferably, the upper electrode 51 extends from a region as the capacitor 4 opposed to the lower electrode 41 to a region opposed to both the coil openings C1 and C2. More preferably, the upper electrode 51 is disposed in a region opposed to the entire surface of the coil region. It is expected that, if the arrangement region of the upper electrode 51 is increased as such, the shield effect is improved by the increase in the arrangement region. In an example illustrated in FIG. 6, the upper electrode 51 is formed over the entire surface of the coil region.

If the explanation made with reference to FIGS. 2 to 6 is put in another way in light of FIG. 1, the thin film balun according to this embodiment has the unbalanced circuit, the unbalanced circuit includes the transmission line (the first coil section) having the structure in which the pair of ¼ wavelength circuits are coupled, one ¼ wavelength circuit included in the unbalanced circuit is connected to the unbalanced signal terminal, and the other ¼ wavelength circuit is connected to the open end.

This thin film balun has the balanced circuit electromagnetically coupled to the unbalanced circuit. The balanced circuit includes the transmission line (the second coil section) included in the pair of ¼ wavelength circuit. One end of one ¼ wavelength circuit included in the balanced circuit is connected to the balanced signal terminal and the other end thereof is connected to one end of the other ¼ wavelength circuit included in the balanced circuit. The other end of the other ¼ wavelength circuit included in the balanced circuit is connected to the balanced signal terminal. One point between the pair of ¼ wavelength circuits included in the balanced circuit is connected to one end of the capacitor and the DC supply terminal. The other end of the capacitor is connected to the ground terminal.

In such circuit structure, any one of the pair of electrodes included in the capacitor has a section opposed to at least one of the first coil and the second coil, the section being integrally formed with a section opposed to the first electrode.

As illustrated in FIG. 7, the first wiring layer 10 to the fifth wiring layer 50 are formed on a substrate 60 made of, for example, alumina. A material and a manufacturing method of the wiring layers 10 to 50 are not limited. However, for example, the wiring layers 10 to 50 are formed by the sputtering, the CVD, the electroplating, or the electroless plating and are made of a material such as Ag, Cu, or Al. Dielectric films 61 to 64 are formed among the respective wiring layers 10 to 50. A material of the dielectric films 61 to 64 is not specifically limited. However, for example, polyimide, photosensitive resin, or the like is used as the dielectric films 62 and 64. The thickness of the dielectric film 61 is, for example, 3 μm to 100 μm. For the dielectric film 61 between the first wiring layer 10 in which the unbalanced transmission line 2 is formed and the second wiring layer 20 in which the balanced transmission line 3 is formed, for example, silicon nitride, silicon oxide, or alumina is used and, for example, silicon nitride having the thickness of 2.0 μm is used. For the dielectric film 63 between the lower electrode 41 and the upper electrode 51 of the capacitor 4, for example, silicon nitride, silicon oxide, or alumina is used.

As described above, in this embodiment, the upper electrode 51 included in the capacitor has the section opposed to at least one of the coils 11 and 12 (the first coils) and the coils 21 and 22 (the second coils), the section being integrally formed with a section opposed to the lower electrode 41. With such structure, the upper electrode 51 is also used as the shield electrode. Therefore, a separate shield electrode is unnecessary. Effects realized by this embodiment will be described below with reference to examples.

EXAMPLE 1

The structure illustrated in FIG. 7 in which the distance t1 from the coil 22 to the upper electrode 51 is set to 70 μm is Example 1. A layout of the respective wiring layers is as illustrated in FIGS. 2 to 6.

COMPARATIVE EXAMPLE 1

Figure 8:
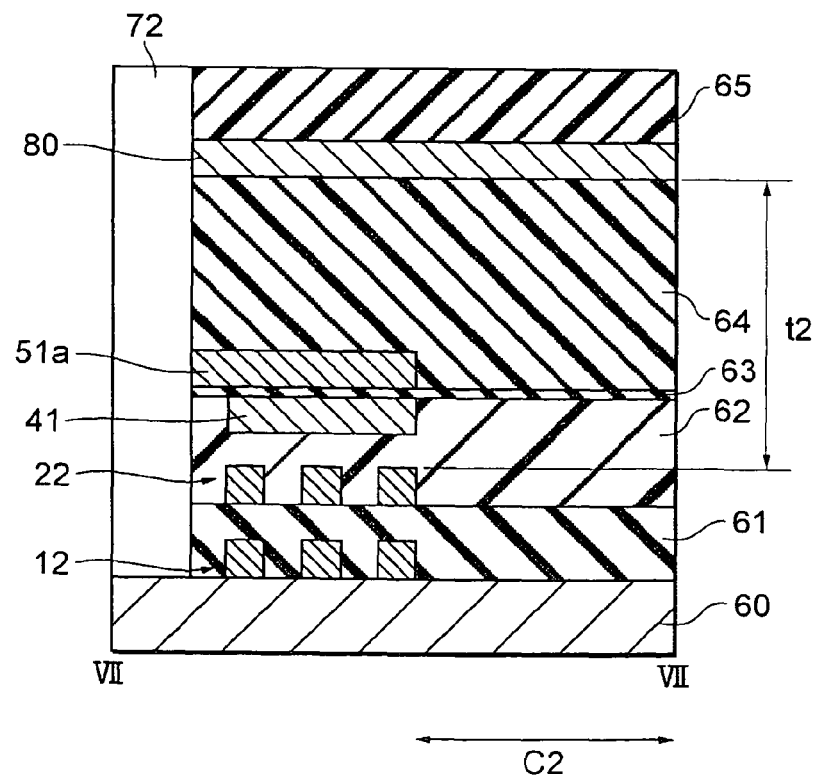
FIG. 8 is a schematic sectional view of a thin film balun 1 according to Comparative example 1.

A schematic sectional view of a thin film balun according to Comparative example 1 is illustrated in FIG. 8. In Comparative example 1, an upper electrode 51*a* was disposed only in a region opposed to the lower electrode 41 and a separately independent shield electrode 80 was disposed in an upper layer of the upper electrode 51*a*. The distance t2 from the coil 22 to the shield electrode 80 was set to 70 μm to have the same shield conditions as Example 1 illustrated in FIG. 7.

Evaluation Result

Figure 9:
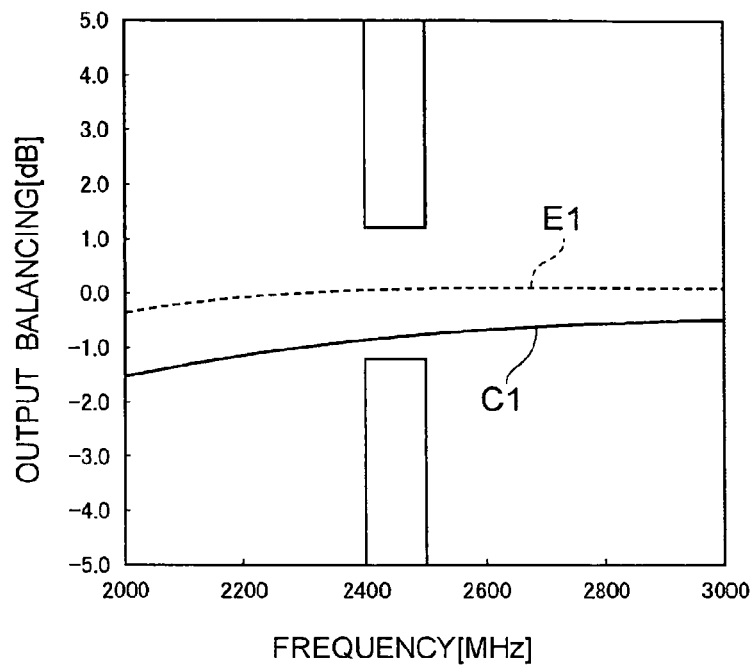
FIG. 9 is a graph illustrating a comparison result of output balancing of Example 1 and Comparative example 1.

Concerning the structure of Example 1 and the structure of Comparative example 1, output balancing between two balanced signals was calculated by simulation. A target frequency was set to 2400 MHz to 2500 MHz. In the following evaluation, the output balancing equal to or higher than −1.0 dB and equal to or lower than 1.0 dB is set as an acceptance criterion. Results are illustrated in FIG. 9. In FIG. 9, E1 indicates a result of Example 1 and C1 indicates a result of Comparative example 1.

Since an output balancing characteristic illustrated in FIG. 9 is an amplitude difference of output from the balanced signal terminal 74 and the balanced signal terminal 75, 0 dB is a more ideal output balancing. As illustrated in FIG. 9, it is seen that the output balancing is excellent in Example 1 compared with Comparative example 1.

This evaluation result will be discussed. In a thin film balun formed by a thin film process, the interlayer distance between a capacitor and a balanced transmission line is short compared with the laminated balun disclosed in Japanese Patent No. 3780414. Therefore, usually, a shield electrode is considered to be set separately from a capacitor electrode and predetermined distance apart from the balanced transmission line. Consequently, it is expected that the balanced transmission characteristics are improved. However, from this experiment result, there is an effect that, since the capacitor electrode is also used as the shield electrode, although some points are still unclear concerning details of operation mechanism, the balanced transmission characteristics are improved compared with the separately optimized and disposed capacitor electrode and shield electrode.

It will be described below, with reference to an example, at least to which degree the upper electrode 51 should be extended from the region opposed to the lower electrode 41 to the periphery to obtain the improvement effect of the balanced transmission characteristics.

EXAMPLE 2

Figure 10:
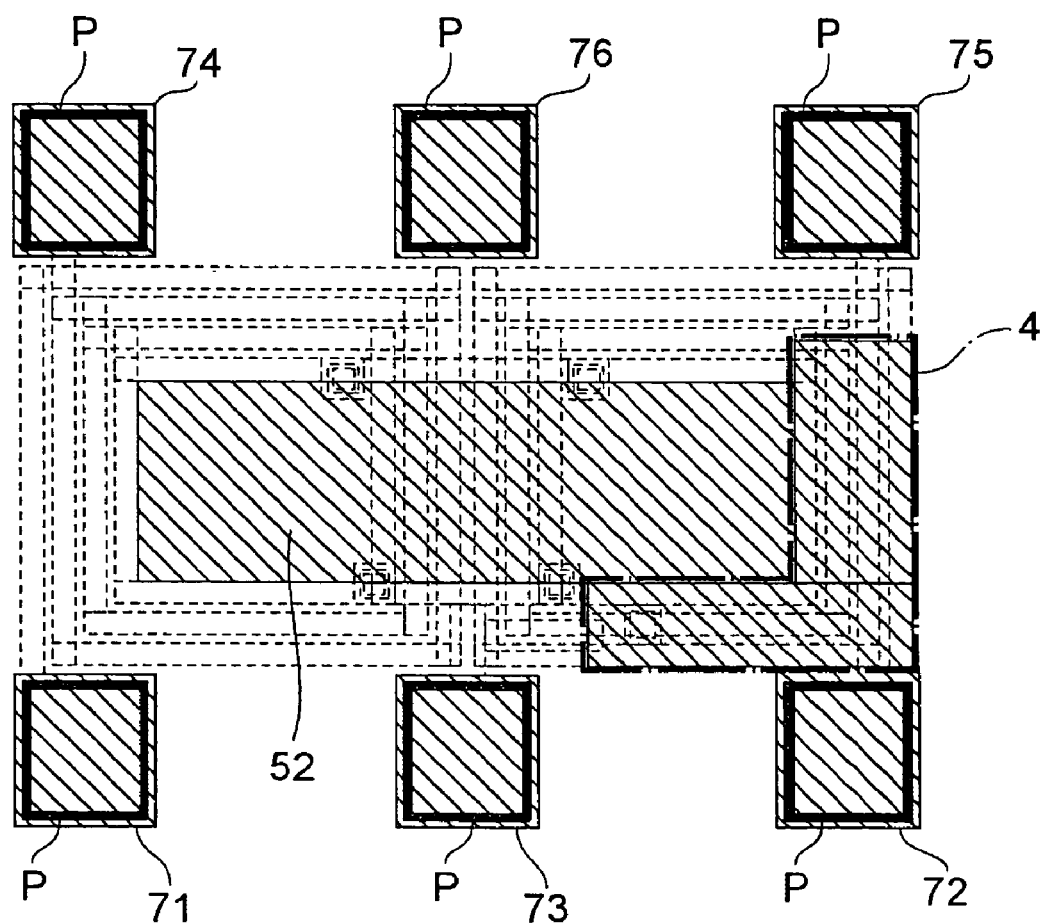
FIG. 10 is a plan view illustrating an upper electrode of a thin film balun according to Example 2.

In Example 2, as illustrated in FIG. 10, an upper electrode 52 which extended from the region opposed to the lower electrode 41 to the region opposed to the two coil openings C1 and C2 was formed. The distance from the coils to the upper electrode was set to 70 μm as in Example 1.

Figure 11:
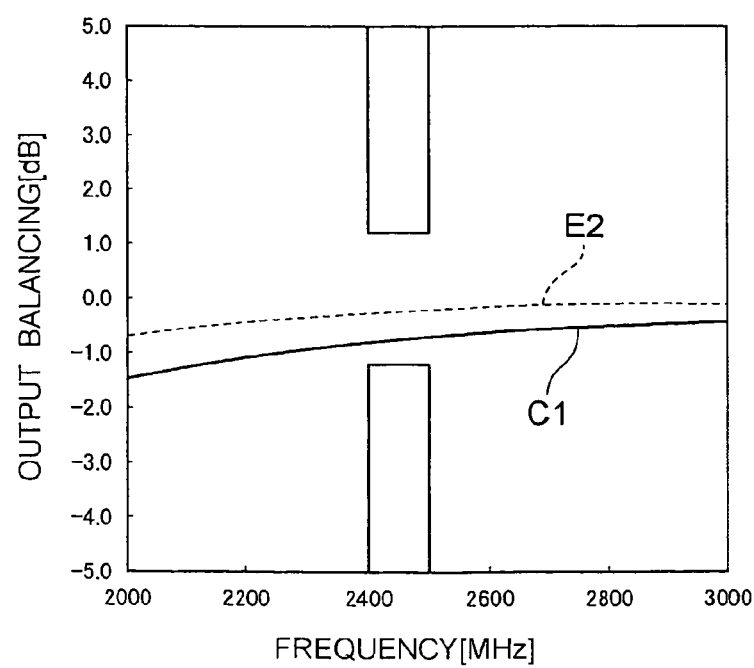
FIG. 11 is a graph illustrating a result of output balancing of Example 2.

In FIG. 11, a result obtained by calculating output balancing of two balanced signals with simulation is illustrated. Conditions are the same as those described with reference to FIG. 9. In FIG. 11, E2 indicates a result of Example 2 and C1 indicates a result of Comparative example 1.

As illustrated in FIG. 11, it is seen that, in Example 2 in which the upper electrode 52 is extended to the coil openings C1 and C2, although the balanced transmission characteristics are inferior to those in Example 1 in which the upper electrode 51 is disposed over the entire surface of the coil region, the balanced transmission characteristics are excellent compared with Comparative example 1.

Figure 12:
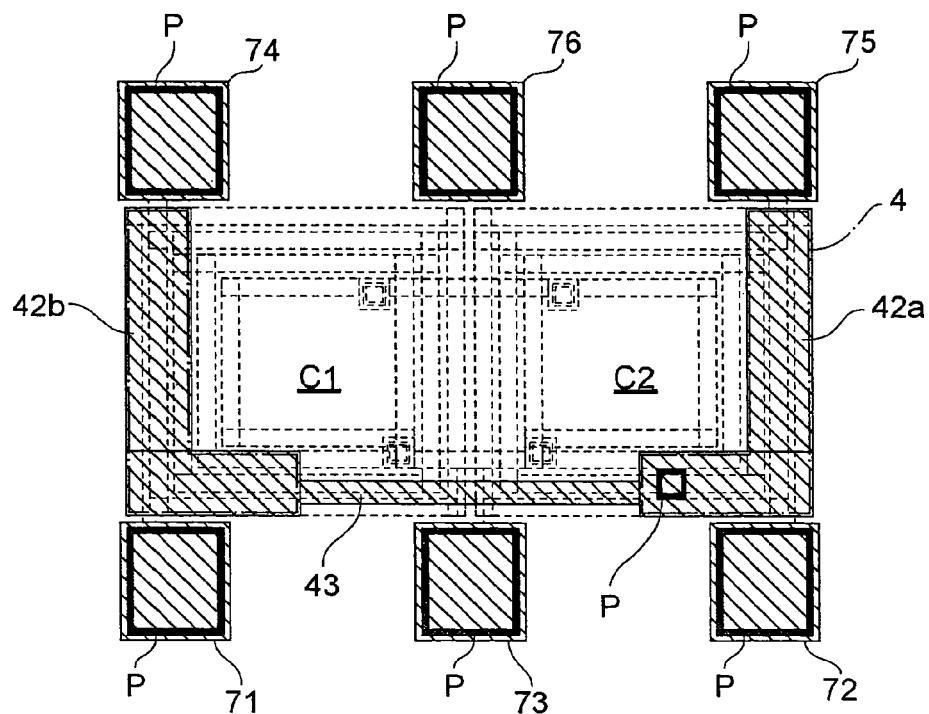
FIG. 12 is a plan view illustrating a lower electrode of Example 3.
Figure 13:
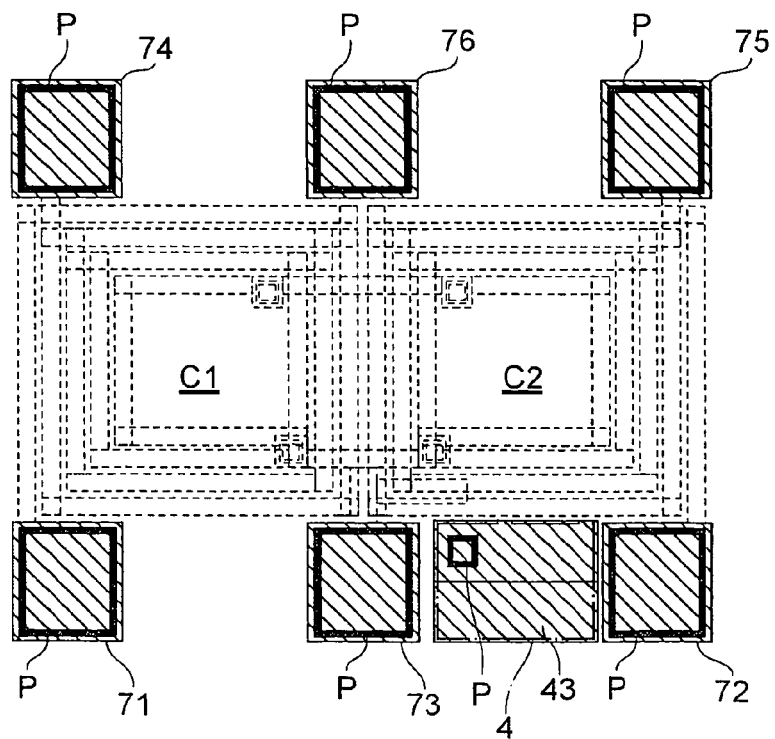
FIG. 13 is a plan view illustrating a lower electrode of Example 4.

Lastly, a preferred modification of the lower electrode will be described with reference to examples. FIGS. 12 and 13 are plan views illustrating another example of the lower electrode.

EXAMPLE 3

In Example 3 illustrated in FIG. 12, lower electrodes 42*a* and 42*b* of the capacitor 4 are disposed to be symmetrical with respect to an imaginary line which divide the left and right coils into individual coils (equal to an imaginary line connecting the NC terminal 76 and the DC supply terminal 73). The lower electrodes 42*a* and 42*b* are arranged not to overlap the coil openings C1 and C2 but to overlap the coil conductors. The lower electrodes 42*a* and 42*b* are connected to each other by a leading wire 43.

EXAMPLE 4

In Example 4 illustrated in FIG. 13, a lower electrode 43 is disposed not to overlap the left and right coils. Specifically, the lower electrode 43 is disposed around the coil on the right side and in a region between the ground terminal 72 and the DC supply terminal 73.

The same effects as Example 1 can be realized by the arrangement illustrated in FIGS. 12 and 13. It is expected that the arrangement of the capacitor symmetrical with respect to the imaginary line which divides the left and right coils as illustrated in FIG. 12 is suitable for the balanced transmission characteristics required to have symmetry. Further, it is expected that the influence on the electromagnetic coupling of the unbalanced transmission line and the balanced transmission line is further reduced by disposing the lower electrode not to overlap the entire coil region including the coil openings, whereby the balanced transmission characteristics are improved.

As described above, the present invention is not limited to the embodiments described above, and many modifications to the embodiments are possible without departing from the gist of the invention. For example, the lower electrode may also be used as the shield electrode. In this case, the lower electrode is connected to the ground terminal 72 and the upper electrode is connected to the DC supply terminal 73 and the balanced transmission line 3. For example, the arrangement of the terminals 71 to 76 is not limited; for example, the NC terminal 76 can be used as the ground terminal. The number of wiring layers constituting the thin film balun 1 may be smaller than four or equal to or larger than five. Further, the same effect is achieved in a structure having the exact opposite layer composition, such as an example where the capacitor is formed in the uppermost layer, and the unbalanced electrode in the lowermost layer. Further, the coil arrangement is not limited; for example, a thin film balun structure may be used in which the four coils of the unbalanced transmission line 2 and balanced transmission line 3 are all stacked, and only one coil opening is defined.

The thin film balun according to the present invention, which allows improvement in the balanced transmission characteristics of the thin film balun with a bias supply capacitor, can be used particularly in radio communication apparatuses requiring miniaturization.

What is claimed is:

1. A thin film balun comprising:
    an unbalanced transmission line which includes a pair of first coils disposed side by side on a same surface;
    a balanced transmission line which includes a pair of second coils and is electromagnetically coupled to the unbalanced transmission line, the pair of second coils being disposed on a different surface from that of the pair of first coils and being opposed to the pair of first coils;
    a first electrode which is connected to both of the second coils constituting the balanced transmission line and constitutes a capacitor;
    a second electrode which is connected to a ground terminal and disposed to be opposed to the first electrode and constitutes the capacitor; and
    a DC supply terminal which is connected to the pair of second coils constituting the balanced transmission line and the first electrode constituting the capacitor, wherein
    the second electrode has a section opposed to at least one of the first coils and the second coils, the section being formed with a section opposed to the first electrode.

2. The thin film balun according to claim 1, wherein the second electrode extends from a region opposed to the first electrode to a region opposed to coil openings of the first coils and the second coils.

3. The thin film balun according to claim 1, wherein the second electrode is disposed in a region opposed to both the first coils and the second coils.

4. The thin film balun according to claim 1, wherein the first electrode is disposed not to overlap the coil openings of the first coils and the second coils.

5. The thin film balun according to claim 1, wherein the first electrode is disposed in a region opposed to coil conductors of the first coils or the second coils.

6. The thin film balun according to claim 1, wherein the first electrode is disposed not to overlap the first coils and the second coils.

7. The thin film balun according to claim 1, wherein the first electrode is disposed to be symmetrical with respect to an imaginary line which divides the pair of first coils or the pair of second coils into individual coils.

8. The thin film balun according to claim 1, wherein a first leading wire connecting the pair of first coils is formed of a different layer than the pair of first coils.

9. The thin film balun according to claim 8, wherein a second leading wire connecting the pair of second coils is formed of a different layer than the pair of second coils.

10. The thin film balun according to claim 1, wherein a first leading wire connects respective ends of the pair of first coils via a first pair of through holes.

11. The thin film balun according to claim 10, wherein a second leading wire connects respective ends of the pair of second coils via a second pair of through holes.

* * * * *